United States Patent [19]
Osterkamp et al.

[11] Patent Number: 4,937,466
[45] Date of Patent: Jun. 26, 1990

[54] REMOTE AS SIGNAL ATTENUATOR

[75] Inventors: Jeff B. Osterkamp; Mark T. Paulsen, both of Westminster, Colo.

[73] Assignee: Ball Corporation, Muncie, Ind.

[21] Appl. No.: 250,905

[22] Filed: Sep. 29, 1988

[51] Int. Cl.⁵ .......................... H03K 5/08; H01P 1/22
[52] U.S. Cl. ..................................... 307/264; 307/548; 307/550; 330/284; 333/81 R
[58] Field of Search .................. 307/540, 546–550, 307/554, 568, 264; 330/284, 145; 333/81 R

[56] References Cited
U.S. PATENT DOCUMENTS

| | | |
|---|---|---|
| 2,842,625 | 7/1958 | Holmes . |
| 3,522,556 | 8/1970 | Ragan . |
| 3,714,462 | 1/1973 | Blackmer . |
| 4,047,131 | 9/1977 | Ludikhuize . |
| 4,236,126 | 11/1980 | Weller et al. . |
| 4,405,903 | 9/1983 | Blackburn . |
| 4,471,324 | 9/1984 | Welland . |
| 4,560,949 | 12/1985 | Young ............................... 330/284 |
| 4,563,775 | 1/1986 | Yokosuka ........................... 330/284 |
| 4,739,283 | 4/1988 | Metz et al. . |
| 5,646,036 | 2/1987 | Brown . |

FOREIGN PATENT DOCUMENTS

| | | | |
|---|---|---|---|
| 2650583 | 3/1978 | Fed. Rep. of Germany ...... 330/284 |
| 1417982 | 12/1975 | United Kingdom ................ 330/284 |

*Primary Examiner*—John Zazworsky
*Attorney, Agent, or Firm*—Sheridan, Ross & McIntosh

[57] ABSTRACT

The present disclosure provides a variable attenuator for attenuating alternating signals, preferably, in a frequency band extending from approximately 10 Hz to 30 MHz. The invention utilizes a junction field-effect transistor (JFET) as a variable impedance. The low drain-to-source capacitance exhibited by the JFET allows it to be modeled as a variable resistor or potentiometer. Further, the low drain-to-source capacitance of the JFET improves the bandwidth of the attenuator. A remote DC control signal defines the resistance provided by the JFET. A feedback loop, responsive to the resistance of the JFET and the remote control signal, controls the resistance provided by the JFET in a linear manner. The DC control signal is low-pass filtered at the feedback loop to reduce any high frequency noise acquired during transmission.

25 Claims, 1 Drawing Sheet

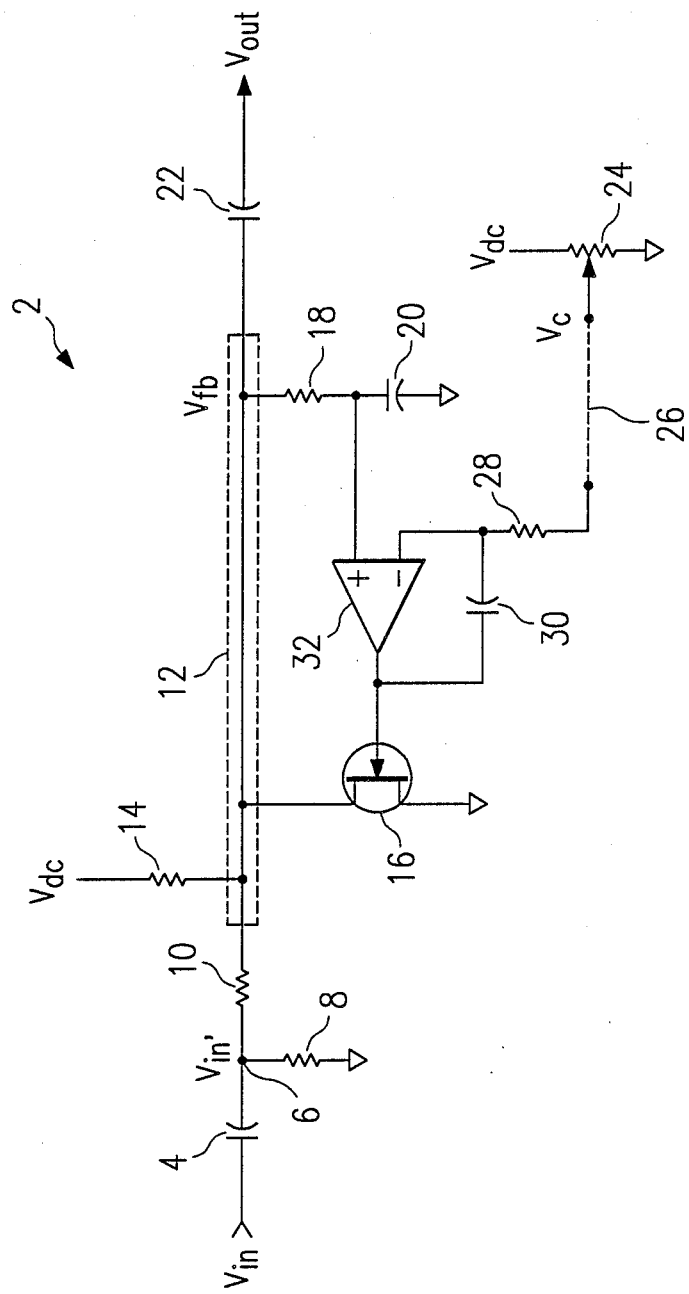

REMOTE AS SIGNAL ATTENUATOR

Field of the Invention

The present invention relates to attenuators for attenuating AC signals.

BACKGROUND OF THE INVENTION

Presently, there are two known techniques that employ a DC control voltage to attenuate AC signals in the frequency band that extends from, approximately, 10 hertz to 30 megahertz. The first type of attenuator is the digital signal multiplier. The digital signal multiplier uses a DC control signal to control the reference voltage in a digital-to-analog (D/A) converter. The D/A converter, in turn, produces an output that is the product of the reference voltage multiplied by the digitized AC signal. Thus, by restricting the reference voltage to a normalized range extending from zero to one, attenuation of the AC signal can be achieved. The digitized AC signal that is input to the D/A converter must first be obtained by pre-processing the AC signal with an analog-to-digital (A/D) converter. Consequently, the digital multiplier attenuator requires both an A/D converter and a D/A converter. There are several drawbacks inherent in such attenuators. Namely, A/D and D/A converters are expensive and complicated. Further, D/A and A/D converters consume a great deal of area on a printed circuit board thereby reducing the functionality per unit area of the printed circuit board. Thus, there exists a need for an inexpensive attenuator that occupies a relatively small amount of printed circuit board area.

The second type of AC signal attenuator that utilizes a DC control signal is an analog multiplier. Typically, the analog multiplier uses a DC control signal to adjust the gain of a logarithmic amplifier. Adjustment of the gain of the logarithmic amplifier results in the desired AC signal attenuation. Exemplary of known analog multipliers is U.S. Pat. No. 3,714,462, issued to Blackmer on Jan. 30, 1973, for an invention entitled "Multiplier Circuits". Of related interest is U.S. Pat. No. 4,471,324 issued to Welland on Sept. 11, 1984, for an "All NPN Variably Controlled Amplifier". Current analog multipliers, however, possess several undesirable features. Namely, known analog multipliers possess bandwidths that are limited to frequencies below 1 megahertz. Consequently, such attenuators are not useful in the frequency band that extends from 1 megahertz to approximately 30 megahertz. Further, known analog multipliers, such as Blackmer, typically exhibit a high part count which increases the cost of the attenuator. Concomitantly, a high part count also increases the amount of printed circuit board area required for the attenuator and, hence, reduces the functionality per unit area of the printed circuit board. In addition, presently known analog multipliers require expensive, high precision parts to realize an attenuator that is both temperature independent and stable throughout its bandwidth. Further, as Blackmer demonstrates, current analog multipliers require a considerable amount of circuitry to realize linear operation. This also increases the cost, complexity and printed circuit board area needed to realize an attenuator. Therefore, there is a further need for an attenuator that exhibits an improved bandwidth, a reduced part count, and provides linear operation without the need for expensive, high precision parts.

Several attenuators which operate in the radio frequency (RF) band, extending from approximately 30 MHz to 10 GHz, and utilize a DC control signal are known. Exemplary of known attenuators which operate in the RF band and utilize a DC control signal is U.S. Pat. No. 4,646,036, issued to Brown on Feb. 24, 1987, for a "Signal Attenuation Circuit". Brown employs a DC control signal to control two PIN diodes that provide variable attenuation of a radio signal.

Automatic gain control circuits, typically, maintain a constant output signal by attenuating or amplifying an input signal as required. Indicative of the automatic gain control circuits is U.S. Pat. No. 4,405,903, issued to Blackburn on Sept. 20, 1983, for a "Variolosser For An Automatic Gain Control Circuit" which, apparently, employs a feedback loop to control a variable impedance diode. The feedback loop operates to maintain a constant input signal to a fixed gain amplifier. Consequently, the signal output by the fixed gain amplifier is also maintained at a constant level.

SUMMARY OF THE INVENTION

The present invention provides a variable attenuator suitable for attenuating signals in the frequency band that extends from approximately 10 Hz to 30 MHz. The present invention is comprised of means for defining a DC control signal that reflects the desired degree of attenuation of the AC signal. The invention further includes a variable attenuator means that is, in the preferred embodiment, comprised of a fixed resistor and a variable resistor. The AC signal is divided or attenuated by the voltage divider according to a ratio defined by the variable resistor and the fixed resistor. The present invention further includes a means for adjusting the variable resistor to achieve the desired degree of attenuation of the AC signal. The means for adjusting is, preferably, a feedback loop that is responsive to both a DC control signal that defines the desired degree of attenuation of the AC signal and a DC feedback signal that reflects the current resistance of the variable resistor and, hence, the current degree of attenuation of the AC signal. The feedback circuit operates to, in a linear fashion, adjust the variable resistor to reflect the desired attenuation as defined by the DC control signal.

The present invention provides numerous advantages. Among the advantages, a variable attenuator is provided that employs a feedback loop to linearly adjust a variable resistance element in accordance with a DC control signal that defines the desired degree of attenuation. Another advantage of the present invention is that inexpensive parts can be employed due, primarily, to the feedback loop being closed around a DC signal rather than the AC signal. Consequently, the need for expensive, high precision parts that are stable over extended temperature and frequency ranges is reduced. Further, the invention can be practiced without resorting to expensive and complex A/D and D/A converters. In addition, the present invention provides a reduced part count, relative to known AC signal attenuators in the relevant frequency band, that further reduces the cost thereof. Concomitantly, a reduced part count reduces the area on a printed circuit board occupied by the present invention. Thus, the functionality per unit area of the printed circuit board an be increased. Additionally, the present invention provides an improved bandwidth over known attenuators in the frequency band extending from 10 Hz to approximately 30 MHz. Consequently, the present invention can be utilized over a greater frequency range than presently known attenuators in the relevant frequency band. Further, since a DC control signal is employed in the invention, it can be a remote DC control signal. Remote, as used herein, connotes that the DC control signal travels from its source to or toward the location of the attenuating circuitry and the AC signal. The use of a remote DC control signal has several advantages. Among the advantages, the source of the DC control signal can be distally located from the attenuating circuitry since it can be recovered, using relatively simple filtering techniques, at the location of the attenuating circuitry. Thus, a relatively high signal-to-noise ratio of the DC control signal is readily maintained. However, the source of the DC control signal can also be proximally located to the attenuating circuitry and AC signal. In addition, the remote DC signal reduces, if not eliminates, the need for routing the AC signal to a distally located attenuator thereby reducing the exposure of the AC signal to noise and the like.

BRIEF DESCRIPTION OF THE DRAWING

The sole drawing illustrates the preferred embodiment of the invention.

DETAILED DESCRIPTION OF THE PREFERRED EMBODIMENT

With reference to the drawing, the preferred embodiment of the remote video signal attenuator 2, hereinafter attenuator 2, is illustrated. The attenuator 2 operates to reduce or attenuate the amplitude of an alternating signal by adjusting a variable impedance element according to a DC control signal. The alternating input signals upon which the attenuator 2 operates are in the frequency band which extends, approximately, from 10 hertz to approximately 30 megahertz. Several of the components comprising the attenuator 2 serve different purposes depending upon whether the DC or AC operation of the circuit is relevant. Therefore, where pertinent, the DC and AC functions of the components comprising the attenuator 2 are described.

The attenuator 2 includes a capacitor 4 having a terminal for receiving the alternating input signal $V_{in}$ and a second terminal that is connected to a node 6. The capacitor 4, in conjunction with an equivalent resistance at node 6, forms a high-pass filter for eliminating any undesirable low frequency or DC components from the input signal $V_{in}$. Consequently, any DC components present in the input signal are eliminated and thus prevented from influencing the DC operation of the attenuator 2. In the AC operation of the attenuator 2, however, the capacitor 4 and the equivalent resistance at node 6 allow the input signal $V_{in}$, less any DC component, to pass.

The attenuator 2 further includes a resistor 8 connected intermediate the node 6 and ground. The resistor 8 together with other resistive elements forms the equivalent resistance at node 6 that, in combination with the capacitor 4, forms a high-pass filter that eliminates DC and low frequency components from the input signal $V_{in}$. Thus, the DC and low frequency components of the input signal $V_{in}$ in are prevented from affecting the DC operation of the attenuator 2. The AC component $V_{in'}$ of the input signal $V_{in}$ exists across the resistor 8. In the DC operation of the attenuator 2 the resistor 8 combines with other resistive elements to form a first parallel combination. As such, the resistance of the resistor 8 affects the resistance of the first parallel combination.

The attenuator 2 is also comprised of a resistor 10 which, also, serves different purposes in the DC and AC operation of the attenuator 2. In the DC case the resistor 10 in combination with the resistor 8 and other resistive elements form the previously mentioned first parallel combination. Consequently, the resistance of the resistor 10, like resistor 8, affects or determines the resistance of the first parallel combination. In the AC operation of the attenuator 2 the resistor 10, in conjunction with other resistive elements, forms a voltage divider network for attenuating the AC input signal $V_{in'}$. Specifically, the resistor 10 functions as the fixed or unvarying element in the voltage divider. The resistor 10 has a first terminal connected to the node 6 and a second terminal which is connected to a node 12.

Also included in the attenuator 2 is resistor 14 connected intermediate a DC supply voltage $V_{dc}$ and the node 12. In the DC operation of the attenuator 2 the supply voltage $V_{dc}$ is divided between the resistor 14 and the first parallel combination of the resistor 8, the resistor 10 and a variable impedance element to produce a DC feedback signal. The DC feedback signal is, in turn, utilized in controlling the impedance of the variable impedance element and, hence, the impedance of the first parallel combination. The resistor 14 functions, in the AC operation of the attenuator 2, with the resistor 10 and a variable impedance element to form a voltage divider network for attenuating the AC signal $V_{in'}$.

Further included in the attenuator 2 is a junction field-effect transistor (JFET) 16 for providing a variable impedance between its drain and source based upon the voltage existing between its gate and source. The JFET 12 due to its relatively small drain to source capacitance can be modeled as a variable resistor or potentiometer. Notably, the drain-to-source resistance of the JFET 16 varies non-linearly with respect to the gate-to-source voltage. In addition, the JFET 12 exhibits a drain to source resistance that is relatively stable throughout the relevant AC band. Thus, the AC input signal $V_{in'}$ does not affect the magnitude of the resistance. The drain of the JFET 16 is connected to the node 12 while the source is connected to ground. The gate, on the other hand, of the JFET 16 is connected to circuitry which operates to linearly vary the drain-to-source resistance of the JFET 16. In the DC operation of the attenuator 2 the supply voltage $V_{dc}$ is divided between resistor 14 and the first parallel combination formed by the JFET 16 with the resistors 8 and 10. The DC voltage existing across the first parallel combination, $V_{fb}$, is indicative of the resistance of the first parallel combination. As indicative of the resistance of the first parallel combination the DC signal, $V_{fb}$, is supplied to a feedback loop which operates to vary the gate-to-source voltage of the JFET 16 such that the resistance provided by the first parallel combination is in accordance with a DC control signal. In AC operation, the JFET 16, in combination with the resistors 10 and 14, forms a voltage divider network for attenuating the AC input signal $V_{in'}$. More specifically, the AC input signal $V_{in'}$ is divided between the resistor 10 and a second parallel combination formed by the resistor 14 with the JFET 16. It is contemplated that elements exhibiting similar or improved performance characteristics could be readily substituted in place of the JFET 16.

The attenuator 2 further includes the series combination of a resistor 18 and a capacitor 20 connected intermediate node 12 and ground. The resistor 18 and capacitor 20 cooperate to form a low-pass filter for filtering the AC signal component along with any AC noise or the like which may have corrupted the feedback signal $V_{fb}$ during transmission from the drain of the JFET 16 to the junction of the resistor 18 and the capacitor 20. Consequently, in the operation of the attenuator 2 the filtered feedback signal, essentially $V_{fb}$, is produced intermediate the resistor 18 and the capacitor 20. Further, the resistor 18 and the capacitor 20 function to critically damp the feedback signal $V_{fb}$. The critical damping of the feedback signal $V_{fb}$ assures like sensitivity of the feedback signal $V_{fb}$ and a DC control signal.

The equivalent resistance existing at the node 6 that is used in combination with the capacitor 4 to form the previously mentioned high-pass filter is defined, as is known in the art, by the combination of the resistors 8, 10, 14 and 18 together with the JFET 16.

The attenuator 2 further includes a capacitor 22 which operates as a blocking capacitor to prevent the output of any DC signals produced by the operation of the attenuator 2. Conversely, the capacitor 22 allows the attenuated alternating signal $V_{out}$, produced by dividing the AC input signal $V_{in}$, between the resistor 10 and the second parallel combination of the resistor 14 with the JFET 16, to pass. The capacitor 22 includes a first terminal which is connected to the node 12. A second terminal of the capacitor 22 provides the attenuated alternating output signal $V_{out}$ to any subsequent circuitry.

Further included in the attenuator 2 is a variable resistor or potentiometer 24 for producing a DC control signal $V_c$ that is indicative of the desired degree of attenuation. The attenuator 2 is not restricted to the use of the potentiometer 24. Rather, it is contemplated that other devices capable of generating a DC control signal can readily replace the potentiometer 24. The resistor terminals of the variable resistor 24 are connected to a DC supply voltage $V_{dc}$ and ground, respectively. The adjustable wiper arm of the variable resistor 24 allows an operator or other control circuitry to define the DC control signal, $V_c$, existing between the wiper arm of the variable resistor 20 and ground.

A transmission path 26 is provided for transmitting the DC control signal $V_c$ from the variable resistor 24 to or toward the location of the input signal $V_{in}$. Thus, any need to route the input signal $V_{in}$ to the location of an attenuator is reduced. Concomitantly, the exposure of the input signal $V_{in}$ to noise and the like is also reduced. Since the DC control signal is routed to or toward the location of the input signal $V_{in}$ it is a remote DC control signal. Thus, remote, in regards to the DC control signal, implies that the DC control signal travels to or toward the location of the input signal $V_{in}$. The transmission path 26 can be of any length. Further, the complexity of the transmission path 26 is susceptible to broad variations. For example, the transmission path could be as simple as a wire or as complicated as a radio transmission link.

Further included in the attenuator 2 are a resistor 28 and a capacitor 30 connected in series intermediate the wiper arm of the variable resistor 24 and the gate of the JFET 16. The resistor 28 and the capacitor 30 cooperate to form a low-pass filter to remove noise and the like which has corrupted the DC control signal $V_c$ during propagation along the transmission path 26. Since a DC control signal is employed, the relatively simple filter formed by the resistor 28 and the capacitor 30 produces a relatively high signal-to-noise ratio. Consequently, in the DC operation of the attenuator 2 a clean or filtered DC control signal $V_c$ is produced intermediate the resistor 28 and the capacitor 30. Further, the combination of the resistor 28 and the capacitor 30 operate to critically damp the the DC control signal $V_c$ thereby assuring like sensitivity with the feedback signal $V_{fb}$.

Further, the drain-to-source capacitance of the JFET 16 (not shown) in combination with the resistor 10 and the resistor 14 determine the worst case, upper bandwidth of the attenuator 2. The 3 db equation is as follows:

$$\text{frequency [3 db]} = \frac{1}{2\pi(R_{10} \| R_{14})C_{JFET}} \quad (1)$$

The JFET 16, due to its extremely low drain-to-source capacitance (not shown) can be designed to have an upper bandwidth that extends to the upper limits of video signal band, approximately 30 MHz. Similarly, the highpass filter formed by the capacitor 4 and the equivalent resistance at node 6 determines the lower frequency limit of the attenuator 2.

Also included in the attenuator 2 is a differential amplifier 32 for controlling the resistance existing between the drain and the source of the JFET 16. More specifically, the differential amplifier 32 functions at DC to generate an output signal which controls the gate-to-source voltage of the JFET 16 such that the first parallel combination of the resistors 8 and 10 with the JFET 16 is proportional to the resistance existing between the wiper arm of the variable resistor 24 and ground. The non-inverting terminal of the differential amplifier 32 receives the feedback signal $V_{fb}$ that is indicative of the resistance provided by the first parallel combination of resistor 8 and the resistor 10 with the JFET 16. The inverting terminal of the differential amplifier 32 receives, due to the filtering provided by the resistor 28 and the capacitor 30, essentially the DC control signal $V_c$ that is indicative of the resistance existing between the wiper arm of the variable resistor 24 and ground. If there is any difference between the signals supplied to the inverting and non-inverting terminals, then the differential amplifier 32 produces an output signal that varies the gate-to-source voltage of the JFET 16 and, hence, the drain-to-source resistance of the JFET 16 so as to reduce any difference existing therebetween. If, on the other hand, the signals at the non-inverting and inverting terminals are equal then the output signal is maintained. Further, to assure like sensitivity of the signals input to the differential amplifier 32, $V_{fb}$ and $V_c$, during DC operation of the attenuator 2 the product of resistor 18 times the capacitor 20 should equal the product of the resistor 28 times the capacitor 30. In contrast, the differential amplifier 32 operates at AC so as not to affect the drain-to-source resistance of the JFET 16 established at DC. Specifically, the capacitors 20 and 30 can be modeled as shorts at AC. Consequently the differential amplifier 32 is in a grounded voltage follower configuration that does not affect or alter the drain-to-source resistance of the JFET 16 established at DC.

Having described the elements comprising the attenuator 2 and their interconnection, it is now necessary to describe the operation of the attenuator 2. The operation or function of several of the elements comprising the attenuator 2 varies depending upon whether DC or AC operation is relevant. Consequently, the following description of the method of operation of the attenuator 2 is partitioned into a description of the DC operation and the AC operation.

At DC, the attenuator 2 operates to proportionally or linearly vary the resistance of the first parallel combination of the resistors 8 and 10 with the JFET 16 according to the resistance existing between the wiper arm of variable resistor 24 and ground. For purposes of illustrating the DC operation of the attenuator 2, the capacitors 4 and 22 can be considered open circuits thereby eliminating any AC driving forces from affecting the DC operation of the attenuator 2 and preventing the feedback signal $V_{fb}$ from affecting the output signal $V_{out}$. Consequently, the only driving force present in the DC operation of the attenuator 2 is the DC supply voltage $V_{dc}$. Further, the input impedance of the differential amplifier 32 can be considered infinite. Consequently, due to the very large input impedance of the differential amplifier 32, the resistors 18 and 28 can be considered short circuits and the capacitors 20 and 30 can be considered open circuits. Hence, the lowpass filters formed by the combination of the resistor 28 with the capacitor 30 and the resistor 18 with the capacitor 20 produce, respectively, a DC control signal $V_c$, indicative of the resistance existing between the wiper arm of the variable resistor 24 and ground, and a feedback signal $V_{fb}$, indicative of the resistance of the first parallel combination of the resistor 8, the resistor 10 and the JFET 16. The DC control signal $V_c$ and feedback signal $V_{fb}$ are applied, respectively, to the inverting and non-inverting terminals of the differential amplifier 32. The differential amplifier 32 produces an output signal that reduces the difference between the signals existing at its non-inverting and inverting terminals. Consequently, any difference in the voltages of the DC control signal $V_c$ and the feedback signal $V_{fb}$ results in a change in the output signal of the differential amplifier 32. The output signal of the differential amplifier 32 varies the gate-to-source voltage of the JFET 16 and, hence, the resistance of the first parallel combination. Once the voltage across the first parallel combination and the voltage between the wiper arm of the variable resistor 24 and ground are equal, the differential amplifier 32 operates to maintain its output voltage.

The attenuator 2 at AC operates to attenuate the AC input signal $V_{in'}$. At AC, the high pass filter formed by the capacitor 4 and the equivalent resistance at node 6 allows the AC input signal $V_{in'}$ to pass while eliminating any DC component therefrom. Consequently, the AC input signal $V_{in'}$ exists across the resistor 8. Similarly, the capacitor 20 can be considered a short circuit at AC thereby grounding the non-inverting terminal of the differential amplifier 32. Thus, the AC input signal $V_{in'}$ cannot influence the non-inverting terminal of the differential amplifier 32. Likewise, the capacitor 30 can also be considered a short at AC thereby establishing a virtual ground at the inverting terminal of the differential amplifier 32. The resistor 18, for reasons explained hereinafter, is designed to be much larger than resistor 14 and can also be modeled as an open circuit at AC. Thus, the differential amplifier 32 is in a grounded voltage follower configuration which prevents the AC input signal $V_{in'}$ from influencing the resistance of the JFET 16 established during DC operation by the differential amplifier 32. Also, the DC supply voltages $V_{dc}$ are considered to have zero source impedance and, hence, are considered shorts to ground. Thus, the AC input signal $V_{in'}$ existing at the resistor 8 is divided between the resistor 10 and the second parallel combination formed by the resistor 14 and the JFET 16. Notably, the resistance of JFET 16 established at DC does not change when the AC operation of the attenuator is considered. Further, there is a linear relationship between the first parallel combination and the second parallel combination. Consequently, the degree of attenuation imposed upon the AC input signal $V_{in'}$ to produce the output signal $V_{out}$ is linearly related to the DC control signal. The capacitor 22 is a short at AC thereby allowing the attenuated signal $V_{out}$ to pass while inhibiting the DC feedback signal $V_{fb}$ produced during the DC operation of the attenuator 2. Further, since resistor 18 is much larger than resistor 14, it does not affect the attenuation of the AC input signal $V_{in'}$.

What is claimed is:

1. A variable attenuator for attenuating alternating signals, comprising:

variable attenuation means for attenuating an alternating signal, said variable attenuation means including variable resistor means having a first terminal and a second terminal between which a variable resistance exists and fixed resistor means located between said first and second terminals;

means for defining a desired attenuation of said variable attenuation means; and means, responsive to the attenuation of said variable attenuation means and said means for defining, for adjusting said variable attenuation means to said desired attenuation.

2. A variable attenuator, as claimed in claim 1, wherein:

said variable attenuation means includes non-linear variable attenuation means.

3. A variable attenuator, as claimed in claim 2, wherein:

said means for adjusting includes feedback means for linearly adjusting said non-linear variable attenuation means.

4. A variable attenuator, as claimed in claim 2, wherein:

said non-linear variable attenuation means includes a junction field-effect-transistor.

5. A variable attenuator, as claimed in claim 1, wherein:

said variable attenuation means includes means for generating a DC signal, wherein said DC signal indicates the degree of attenuation of said variable attenuation means to said means for adjusting.

6. A variable attenuator, as claimed in claim 5, wherein:

said means for generating a DC signal includes dividing means.

7. A variable attenuator, as claimed in claim 1, wherein:

said means for defining includes means for generating a DC signal.

8. A variable attenuator, as claimed in claim 1, wherein:

said means for defining includes means for generating a remote DC signal.

9. A variable attenuator, as claimed in claim 8, wherein:

said means for generating a remote DC signal includes means for filtering said remote DC signal.

10. A variable attenuator, as claimed in claim 1, wherein:

said means for adjusting includes a feedback means for linearly adjusting said variable attenuation means.

11. An apparatus, as claimed in claim 1, wherein:
said variable attenuation means is operative in a bandwidth extending from approximately 10 Hz to approximately 30 MHz.

12. A variable attenuator for attenuating alternating signals, comprising:
variable attenuation means for attenuating an alternating signal, said variable attenuation means consisting of resistor means and capacitor means for defining a bandwidth;
means for defining a desired attenuation; and
means, responsive to the attenuation of said variable attenuation means and said means for defining, for adjusting said variable attenuation means to said desired attenuation.

13. A variable attenuator, as claimed in claim 12, wherein:
said variable attenuation means includes non-linear attenuation means.

14. A variable attenuator, as claimed in claim 13, wherein:
said means for adjusting includes feedback means for linearly adjusting said non-linear attenuation means.

15. A variable attenuator, as claimed in claim 12, wherein:
said means for adjusting includes DC feedback means.

16. An apparatus, as claimed in claim 12, wherein said variable attenuation means is operative within a bandwidth extending from approximately 10 Hz to approximately 30 MHz.

17. An apparatus, as claimed in claim 12, wherein:
said variable attenuation means includes a variable resistor means having a first terminal and a second terminal between which a variable resistance exists and a fixed resistor means located between said first and second terminals of said variable resistor means.

18. A method for attenuating an alternating signal, comprising:
providing means for variable attenuating a signal, said means for variably attenuating includes a variable resistor means having a first terminal and a second terminal between which a variable resistance exists and fixed resistor means located between said first and second terminals;
providing a means for indicating the attenuation of said means for variably attenuating;
providing a means for indicating a desired attenuation of said means for variably attenuating; and
automatically adjusting said means for variably attenuating to said desired attenuation using said means for indicating said attenuation and said means for indicating said desired attenuation.

19. A method for attenuating an alternating signal, comprising:
providing means for variably attenuating a signal, said means for variably attenuating consisting of resistor means and capacitor means for defining a bandwidth;
providing a first signal for indicating the degree of attenuation of said means for variably attenuating;
providing a second signal for indicating a desired degree of attenuation for said means for variably attenuating; and
using said first and second signals to maintain said means for variably attenuating at said desired degree of attenuation.

20. A method for attenuating, as claimed in claim 19, wherein:
said steps of providing said first and second signals includes providing first and second DC signals.

21. A method for attenuating, as claimed in claim 19, wherein:
said step of using said first and second signals includes generating a third signal, representative of any difference between said first and second signals, for maintaining said means for variably attenuating at said desired degree of attenuation.

22. A method for attenuating an alternating signal, comprising:
providing means for attenuating an alternating signal, said means for variably attenuating includes a variable resistor means having a first terminal and a second terminal between which a variable resistance exists and fixed resistor means located between said first and second terminals, said means for variably attenuating consisting of resistor means and capacitor means for defining a bandwidth;
providing a first signal for indicating the degree of attenuation of said means for variably attenuating;
providing a second signal for indicating a desired degree of attenuation for said means for variably attenuating; and
using said first and second signals to adjust said means for variably attenuating to sad desired attenuation.

23. A method, as claimed in claim 22, wherein:
said step of using said first and second signals includes generating a third signal representative of any difference between said first and second signals.

24. An apparatus for attenuating an alternating signal, comprising:
variable attenuation means for attenuating an alternating signal, said variable attenuation means includes a variable resistor means having a first terminal and a second terminal between which a variable resistance exists and fixed resistor means extending between said first and second terminals, said variable attenuation means consisting of resistor means and capacitor means for determining a bandwidth;
means for defining a desired attenuation of said variable attenuation means; and
means, responsive to the attenuation of said variable attenuation means and said means for defining, for adjusting said variable attenuation means to said desired attenuation.

25. A variable attenuator, as claimed in claim 24, wherein:
said bandwidth extending from approximately 10 Hz to approximately 30 MHz.

* * * * *

UNITED STATES PATENT AND TRADEMARK OFFICE
CERTIFICATE OF CORRECTION

PATENT NO. : 4,937,466

DATED : June 26, 1990

INVENTOR(S) : Osterkamp et al.

It is certified that error appears in the above-identified patent and that said Letters Patent is hereby corrected as shown below:

On the title page and Column 1, line 2, please delete "AS" and insert -- AC -- therefor.

On the title page in "References Cited", please delete patent number "5,646,036" and insert -- 4,646,036 -- therefor.

On the title page in the Abstract, first line, please delete "disclosure" and insert -- invention -- therefor.

In Column 10, Claim 22, line 39, please delete "sad" and insert -- said -- therefor.

Signed and Sealed this

Twenty-second Day of October, 1991

Attest:

HARRY F. MANBECK, JR.

*Attesting Officer*　　　　　*Commissioner of Patents and Trademarks*